United States Patent [19]

Ito et al.

[11] Patent Number: 5,407,786
[45] Date of Patent: Apr. 18, 1995

[54] METHOD OF FORMING A MASK ON A SEMICONDUCTOR SUBSTRATE VIA PHOTOSENSITIVE RESIN DEPOSITION, AMMONIA TREATMENT AND SELECTIVE SILYLATION

[75] Inventors: Shinishi Ito, Yokohama; Haruo Okano; Makoto Nakase, both of Tokyo, all of Japan

[73] Assignee: Kabushiki Kaisha Toshiba, Kawasaki, Japan

[21] Appl. No.: 990,822

[22] Filed: Dec. 14, 1992

Related U.S. Application Data

[63] Continuation-in-part of Ser. No. 825,284, Jan. 27, 1992, abandoned, which is a continuation of Ser. No. 387,797, Aug. 1, 1989, abandoned.

[30] Foreign Application Priority Data

| Aug. 9, 1988 | [JP] | Japan | 63-197115 |
| Aug. 9, 1988 | [JP] | Japan | 63-197118 |
| Aug. 9, 1988 | [JP] | Japan | 63-243865 |

[51] Int. Cl.⁶ ............... G03F 7/36; G03F 7/38
[52] U.S. Cl. .................... 430/313; 430/314; 430/323; 430/324; 430/325; 430/326
[58] Field of Search ............... 430/313, 314, 323, 324, 430/325, 326

[56] References Cited

U.S. PATENT DOCUMENTS

| 4,104,070 | 8/1978 | Moritz et al. | 430/325 |
| 4,613,398 | 9/1986 | Chiong et al. | 430/313 |
| 4,744,639 | 5/1988 | Tsuboyama | 350/350 S |
| 4,751,170 | 6/1988 | Mimura | 430/313 |
| 4,775,609 | 10/1988 | McFarland | 430/325 |
| 4,808,511 | 2/1989 | Holmes | 430/325 |
| 5,041,362 | 8/1991 | Douglas | 430/323 |

FOREIGN PATENT DOCUMENTS

| 291670 | 11/1988 | European Pat. Off. |
| 57-173943 | 10/1982 | Japan. |
| 57-176040 | 10/1982 | Japan. |
| 59-61928 | 4/1984 | Japan. |
| 0184567 | 3/1985 | United Kingdom ......... 430/189 |
| 2171530 | 8/1986 | United Kingdom. |

OTHER PUBLICATIONS

IBM Technical Disclosure Bulletin, vol. 24, No. 10, Mar. 1982 "Image Reversal Liftoff Process", Hamel et al.
IBM Technical Disclosure Bulletin, vol. 27, No. 1A, Jun. 1984 "Image Reversal . . . Diazoquinone Derivatives", Chiong et al.
Research Disclosure, Feb. 1986, No. 26214, "Image Reversal of Positive Photoresists without additives".
Semiconductor International, Apr. 1987, "Positive Photoresist Enhancement Options", Burgraaf.
SPIE vol. 811 Proceedings, Apr. 2–3, 1987, "Mechanism of the Desire Process", B. Roland et al., pp. 55–61.
SPIE vol. 771 Proceedings, 1987, Mechanism and Kinetics of Silylation of Resist Layers from the Gas Phase, Visser et al., pp. 1–7.
Wolf et al., "The Scope and Mechanism of New Positive Tone Gas-Phase-Functionalized Plasma-Developed Resists", Journal of Electrochemical Society, pp. 1664–1669, Jul. 1984.

*Primary Examiner*—Charles L. Bowers, Jr.
*Assistant Examiner*—Christopher G. Young
*Attorney, Agent, or Firm*—Foley & Lardner

[57] ABSTRACT

A photosensitive organic resin layer is formed on a semiconductor substrate. The resin layer is treated with ammonia before or after the resin layer is exposed. Then, the exposed organic resin layer is easily silylated. Due to the ammonia treatment, non-exposed portions of the organic resin layer is hardly silylated so that a high aspect ratio of patterning is realized.

12 Claims, 3 Drawing Sheets

METHOD OF FORMING A MASK ON A SEMICONDUCTOR SUBSTRATE VIA PHOTOSENSITIVE RESIN DEPOSITION, AMMONIA TREATMENT AND SELECTIVE SILYLATION

This application is a continuation-in-part of application Ser. No. 07/825,284, filed Jan. 27, 1992, now abandoned, which is a continuation of application Ser. No. 07/387,797, filed Aug. 1, 1989, now abandoned.

BACKGROUND OF THE INVENTION

1. Field of the Invention

The present invention relates to a method of patterning a resist during a lithography process in manufacturing a semiconductor device. Particularly, the invention relates to a patterning method employing a silylating process.

2. Description of the Prior Art

Recent semiconductor technologies have improved the speed and integration of semiconductor devices and elements. This has increased the necessity of minimizing patterns formed on the semiconductor devices and of improving accuracy of the patterns.

A prevalent lithography process employs a photosensitive polymer (resist) pattern as a mask to etch a base thin film according to a reactive ion etching (RIE) method. The resist pattern shall be formed accurately with high aspect ratio on the stepped surface of a semiconductor element. This requirement is hardly met with a monolayer process of optical lithography technique. This increases the importance of employing a multilayer resist method.

According to the multilayer resist method, multiple layers provide respective resist functions. Namely, a resist layer of 2 to 3 $\mu m$ in thickness is disposed on the surface of a semiconductor element to flatten steps formed on the surface of the element and absorb light reflected by a substrate of the element. On the resist layer, a high-resolution resist layer is disposed to form a pattern. Since the exposure and development of the pattern is carried out away from the substrate and under ideal conditions, the pattern will be of high resolution and have accurate dimensions.

The multilayer resist method is achieved in various ways depending on the number of layers and the techniques of transferring a pattern to lower layers.

A typical one of the multilayer methods is a three layer resist method which provides upper and lower resist layers and an intermediate resist layer disposed between the upper and lower resist layers. According to the three layer resist method, a pattern is transferred from the upper layer to the intermediate layer and from the intermediate layer to the lower layer with the use of a reactive ion etching (RIE) process. The intermediate layer prevents the upper and lower resist layers from interacting with each other and provides pressure resistance for the lower resist layer when the lower layer is subjected to the RIE process. To achieve this function, the intermediate layer is usually made of SOG (spin on glass, i.e., organic silicon glass) formed according to a spin coating method.

The three layer resist method is relatively stable compared to other methods. However, it involves complicated processes, including two RIE processes, so that the three layer resist method may not be practical to apply for mass production.

To simplify the processes, various techniques have been discussed. One of the more promising techniques is a silylating process. This process realizes the function of the three layer resist method, but only with monolayer resist. Therefore, the silylating process may be an ideal and ultimate resist process.

A Japanese Laid Open Patent Application No. 61-107346 discloses a typical silylating process. This process will be explained with reference to FIGS. 1(a) to 1(d).

In FIG. 1(a), the surface of a substrate 1 is coated with a photosensitive resin layer 2, and a mask 3 is disposed on the resin layer 2. The resin layer 2 with the mask 3 on it is exposed against exposure rays 4 such as ultraviolet rays to form exposed portions 5 on the photosensitive resin layer 2, as shown in FIG. 1(b). Silicon compounds are applied to the exposed portions 5. The silicon compounds are selectively absorbed by the exposed portions 5 to form silylated layers 6 as shown in FIG. 1(c). Then, an etching process is carried out to remove non-exposed portions of the photosensitive resin layer 2 to form a pattern as shown in FIG. 1(d).

According to such a conventional silylating process, not only the exposed portions 5 but also the non-exposed portions are silylated to form silylated layers 6a. The layers 6a are minor if compared to the silylated layers 6, but the layers 6a deteriorate selectivity of the pattern. Therefore, the conventional silylating process is not practically applicable and, depending on conditions, it causes cracks as shown in FIG. 2.

The silylated layers 6a formed on the non-exposed portions, respectively, shall be removed. For this purpose, mixed gases such as gases of $CF_4$ and $O_2$ or gases of $C_2F_6$ and $O_2$ are used to etch the silylated layers 6a. However, when the silylated layers 6a on the non-exposed portions are etched with the mixed gases, the silylated layers 6 on the exposed portions are also etched. Since an etching speed of the exposed portions is higher than that of the non-exposed portions, the silylated layers 6 are etched more than the silylated layers 6a. Then, the pattern is not accurately formed. In addition, the reactive etching with oxygen may leave scum.

SUMMARY OF THE INVENTION

The present invention is to solve such problems of the conventional silylating patterning method which not only exposed portions but also non-exposed portions are silylated so that pattern selectivity deteriorates and the quality of the pattern is degraded. An object of the invention is to selectively silanize desired portions of a photosensitive resin layer to provide a satisfactory pattern.

According to an aspect of the invention, a photosensitive resin layer is treated with alkali before or after the photosensitive resin layer is exposed. Then, the photosensitive resin layer is silylated.

The photosensitive resin or resist layer contains as a photoactive material a diazo-quinone derivative. The diazo-quinone derivative becomes a ketene when it is irradiated with light. The ketene reacts with water contained in air to become carboxylic acid. The carboxylic acid hydrogen bonds with a —OH radical of a polymer contained in the photosensitive resin layer. Further, the carboxylic acid undergoes dehydration and degeneracy reactions when heated, to become an ester. The hydrogen bonding and dehydration and degeneracy reactions prevent polymers from absorbing the silicon compounds as well as preventing the polymers from reacting with the silicon compounds.

In this way, if there is a large amount of carboxylic acid in the photosensitive resin layer, exposed portions of the layer are not satisfactorily selected with respect to non-exposed portions of the layer after the silanization, so that a good pattern may not be obtained.

The present invention utilizes the fact that the carboxylic acid undergoes a decarbonating reaction with alkali, and the invention treats the exposed portions of the photosensitive resin layer with the alkali to decompose the carboxylic acid contained in the photosensitive resin layer. As a result, silicon compounds are quickly absorbed by the photosensitive resin layer to provide a good pattern at high selectivity.

If the photosensitive resin layer is treated with alkali before the exposing process, the carboxylic acid and carboxylate are quickly decomposed by the alkali. Therefore, the silicon compounds are quickly absorbed by the photosensitive resin layer to improve selectivity and provide a good pattern. In addition, the basic treatment suppresses the absorption of silicon compounds by the non-exposed portions of the photosensitive resin layer, although the suppression is not so conspicuous.

It should be noted that ammonia is used only as a catalyst which does not undergo any chemical change during the process. In the presence of this catalyst, the carboxylic acid in the exposed positive photoresist is decomposed into carbon dioxide and a hydrocarbon which can be easily silylated. The ammonia may cause an acid-base reaction with the carboxylic acid as well as decomposition of the carboxylic acid. The resulting product of the acid-base reaction cannot effectively be silylated. But since ammonia is a weak alkali (pKb=4.95), decarboxylation occurs without substantial adverse acid-base reaction.

Next, an example of the silylation process will be explained. When applied to the photoresist exposed to UV light, ammonia functions as a catalyst to accelerate the following chemical reaction.

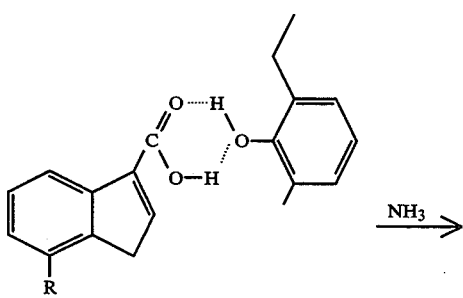

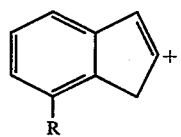

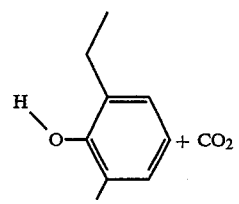

As seen from right side of the above chemical equation, the —OH group is exposed by this reaction. This is particularly important because silylation takes place in accordance with the following chemical reaction. Namely, HMDS substantially reacts with the —OH groups of the photoresist. On the left hand side of the above equation, the —OH groups in the photoresist are coupled with the carboxylic acid by hydrogen bonds and silylation cannot effectively be carried out with these coupled chemicals.

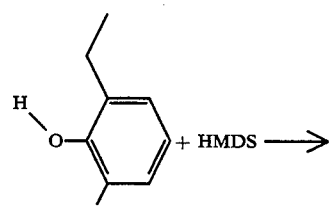

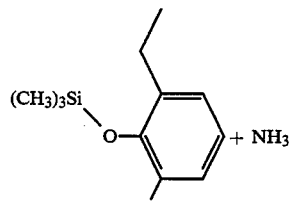

HMDS and the phenolic acid produce ammonia as a result of silylation. The ammonia produced in this later reaction serves as source of catalyst for the former reaction, i.e., the reaction is a chain reaction. The reaction according to the present invention is initiated by first adding an amount of ammonia and is spontaneously continued with the ammonia produced as a result of the silylation reaction. The silylation reaction may be reversed if the amount of coexisting ammonia is too great. Accordingly, it is important to use an appropriate amount of ammonia to be applied in the initial stage. This amount can be readily determined.

In the preferred embodiment, decarboxylation and silylation take place simultaneously. However, the present invention also can be used when ammonia is not generated during silylation, by completing decarboxylation in advance of silylation process.

DETAILED DESCRIPTION OF THE EMBODIMENTS

Figure 1A:
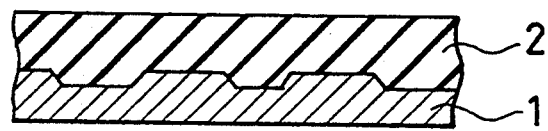
FIGS. 1(a) to 1(d) are sectional views showing a conventional patterning method.
Figure 1B:
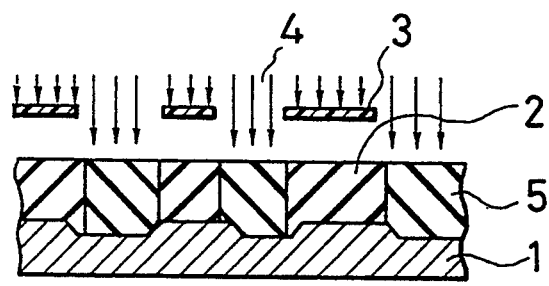
Figure 1C:
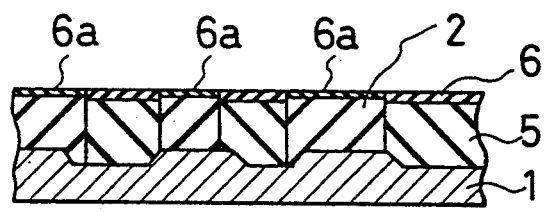
Figure 1D:
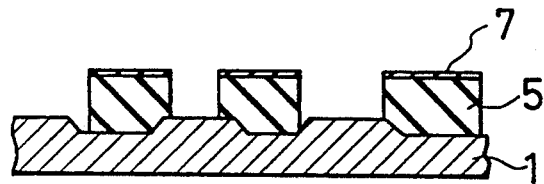
Figure 2:
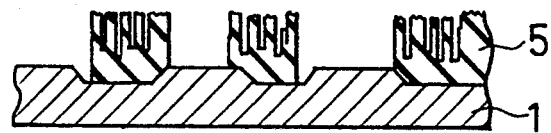
FIG. 2 is a sectional view showing an example of patterns formed according to the conventional patterning method.

Embodiments of the invention will now be described in detail with reference to the drawings.

Embodiment 1

FIGS. 3 (a) to 3 (d) are views showing respective processes according to the first embodiment of the invention. In the figures, parts similar to those shown in FIGS. 1(a) to 1(d) are represented with like reference numerals.

Figure 3A:
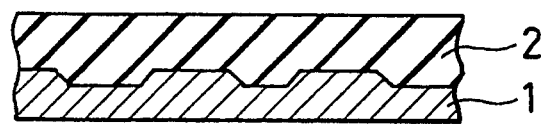
FIGS. 3(a) to 3(d) are sectional views showing a patterning method according to the invention.

In FIG. 3(a), a silicon wafer 1 is coated with a photosensitive resin layer 2 with the use of a spin coat technique at 3500 rpm. The silicon wafer 1 and resin layer 2 are baked for five minutes at 90° C. to prepare a sample. Before coating the photosensitive resin layer 2 over the silicon wafer 1, the wafer 1 is exposed to an atmosphere of hexamethyldisilazane for 120 seconds to reform the surface of the wafer 1 to improve its adhesion.

To prepare the photosensitive resin layer 2, eight grams of novolak resin and two grams of photosensitive material containing photoactive naphthoquinonediazide are dissolved in twenty-three grams of ethylcellosolveacetate and conditioned.

Figure 3B:
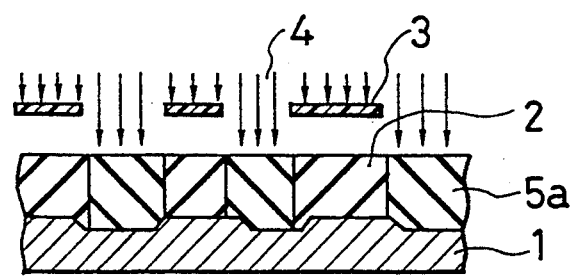

As shown in FIG. 3(b), masks 3 are disposed on the sample, and the sample is exposed to g-line emitted from a mercury lamp to selectively form exposed portions 5, each of 0.5 μm in line width. This exposure process may be achieved with radiation rays such as ultraviolet rays, visible rays, far ultraviolet rays and X-rays, or charged particle beams such as electron beams and ion beams.

To treat the sample with alkali such as ammonia gases, the sample is introduced in a chamber. The chamber is filled with nitrogen at first. Pressure in the chamber is set to 5 Torr, and the temperature of the chamber is maintained at 80° C.–120° C., for eample, 90° C. Then, the ammonia gases are supplied to the chamber. This treatment decomposes carboxylic acid existing in the photosensitive resin layer 2. Instead of exposing the sample to the ammonia gases, the sample may be dipped in a solution such as ammonia water.

Figure 3C:
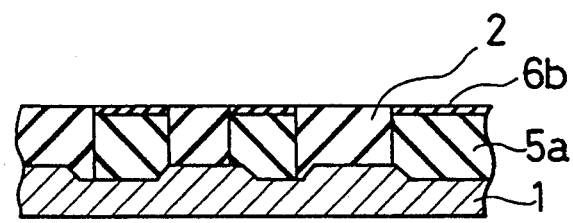

To obtain a good result from the basic treatment, the treatment shall be carried out at or over 50° C. After the basic treatment, the Inner atmosphere of the chamber is replaced with nitrogen. Then, compounds are applied to the sample such that silylated layers 6b are selectively formed on the exposed portions 5 of the resin layer 2, as shown in FIG. 3(c). The silylated layers are not formed on non-exposed portions 5a of the resin layer 2.

Figure 3D:
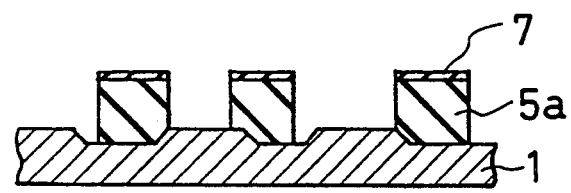

As shown in FIG. 3(d), the non-exposed portions 2 are selectively removed by etching the portions 5a according to a reactive ion etching (RIE) technique, etc. Then, a required negative pattern of 0.5 μm in line width is obtained with an $SiO_2$ layer 7 covering the pattern.

Unlike the conventional patterning method, the method of the invention never forms cracks or cavities on the sample. The reason for this is because the basic treatment makes the exposed portions easily absorb the silicon compounds to increase the density of silicon in the exposed portions, thus improving the degree of hardness of the $SiO_2$ layer 7.

In reactive-ion-etching the non-exposed portions 2, a vacuum vessel having parallel plate electrodes is used. The sample is disposed on one of the parallel plate electrodes. Oxygen gases are introduced to the vacuum vessel, and a high-frequency voltage is applied between the electrodes to generate oxygen plasma with which the sample is etched.

Embodiment 2

Photosensitive material containing naphthoquinonediazide and polyvinylphenol which is polymer are dissolved in ethylcellosolveacetate and conditioned to prepare a photosensitive resin layer.

The photosensitive resin layer thus prepared is coated over a silicon wafer in a manner similar to the embodiment 1 and exposed to prepare a sample.

The sample is placed in a nitrogen atmosphere, and imidazole is employed to decompose carboxylic acid existing in the photosensitive resin layer. Then, similar to the embodiment 1, the sample is silylated with hexamethyldisilazane gases, and reactive-ion-etched with oxygen to accurately form a pattern of 0.5 μm in line width.

Embodiment 3

The time of the basic treatment of this embodiment is different from those of the two previous embodiments. A photosensitive resin layer is spin-coated over a silicon wafer and then treated with ammonia to prepare a sample. The sample is exposed, silylated and etched under the same conditions as those of the previous embodiments. Similar to the previous embodiments, this embodiment can provide an accurate pattern. The alkali may be one of the following amines:

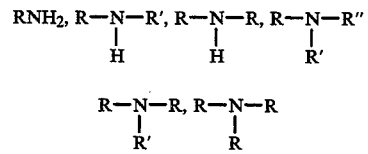

where, R is an alkyl group or aryl group.

Also, the alkali may be imidazole, dimethylamine, trimethylamine, derivatives of them, or a mixture of at least two of them.

The polymer of the photosensitive resist layer may be cresol-novolak resin, xylezole-novolak resin, vinylphenol resin, etc.

Patterning accuracy can be improved by increasing etching resistance of the silylated layer. A concrete example of improving the patterning accuracy will be explained with reference to the next embodiment.

Embodiment 4

A silylated layer is formed according to the processes of the embodiment 1. However, the ammonia treatment is not carried out in the embodiment 4. The embodiment 4 will be explained with reference to FIGS. 1(a) to 1(d).

A wafer is placed in a vacuum chamber. Inner pressure of the chamber is set to 0.1 Torr. $O_2$ gases are injected to the chamber, and gas pressure is set to 1 Torr. A plasma treatment with $O_2$ is carried out at 500 W for 60 seconds. With this plasma treatment with $O_2$, a film 7 of $SiO_2$ structure is formed at least on the surface of each silicon compound layer 6 that has selectively been formed. Instead of treating the wafer with plasma, the wafer may be exposed to a gaseous atmosphere containing oxygen to form a film of $SiO_2$ structure on the surface of the silicon compound layer 6. However, the plasma treatment is advantageous in obtaining etching resistance.

After that, the wafer is selectively etched according to the reactive ion etching technique with oxygen. The etching is carried out with the conditions of 100 sccm in O₂ flow rate, 6.0 Pa in pressure and 150 W in power to form a desired accurate pattern of 0.5 $\mu$m in line width. To obtain a more excellent pattern, silicon compounds adhered to non-silylated surface portions may be removed before executing the oxygen plasma treatment.

Embodiment 5

This is a modification of the embodiment 4. Polyvinylphenol as polymer and photosensitive material containing naphthoquinonediazide are dissolved in ethylcellosolveacetate and coated over a silicon wafer to prepare a sample, similar to the embodiment 4. The sample is exposed and silylated in a nitrogen atmosphere with vaporized hexamethyldisilazane. The sample is subjected to an oxygen plasma treatment at 1.0 Torr and 500 W for 30 seconds. Then, the sample is reactive-ion-etched with oxygen at 100 sccm in flow rate, 6.0 Pa in pressure and 150 W in power. As a result, an accurate pattern of 0.5 $\mu$m in line width is obtained, similar to the embodiment 4.

The sample may be exposed to a gaseous atmosphere of oxygen, $CO_2$, $NO_2$ or $SO_2$, or to a plasma gaseous atmosphere of oxygen, $CO_2$, $NO_2$ or $SO_2$, to harden the silylated layer.

Although the exposed portions have been silylated to obtain negative patterns in the embodiments mentioned in the above, the non-exposed portions may be silylated to obtain positive patterns.

As described in the above, the hardening treatment with oxygen plasma, etc., carried out in the silylating process can improve selectivity of the exposed and non-exposed portions to provide accurate patterns.

Since a small amount of the silicon compounds are unavoidably absorbed by the non-exposed portions of the resin layer, patterning accuracy may slightly deteriorate. If such absorption of the silicon compounds is not ignorable, the following embodiment is effective to improve the patterning accuracy.

Embodiment 6

Figure 4A:
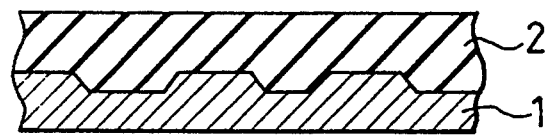
FIGS. 4(a) to 4(e) are sectional views showing another patterning method according to the invention.
Figure 4B:
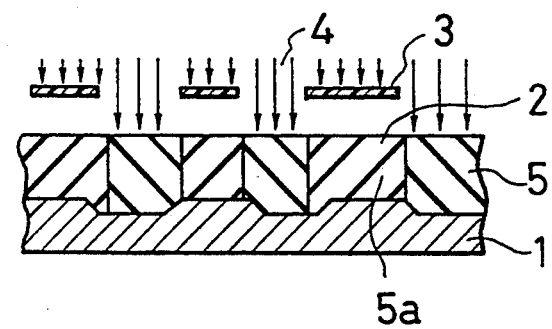

FIGS. 4(a) to 4(d) are sectional views showing processes of the embodiment 6. Novolak resin and naphthoquinonediazide-sulfonic-acid-ester are mixed at a weight ratio of 4:1 and dissolved in ethylcellosolve-acetate and conditioned to form a resist layer as a photosensitive resin layer. The resin layer contains polymer mixed with or engaged with photoactive material. A silicon wafer 1 is exposed to an atmosphere of hexamethyldisilazane for 120 seconds to reform the surface of the wafer 1 to improve its adhesion. The previously prepared resist is spin-coated at 3000 rpm over the wafer 1 to form a sample. The sample is baked at 90° C. for five minutes. Masks 3 are disposed on the sample, and the sample is exposed to g-line 4 emitted from a mercury lamp, as shown in FIG. 4(b) to form exposed portions 5 and non-exposed portions 5a.

Figure 4C:
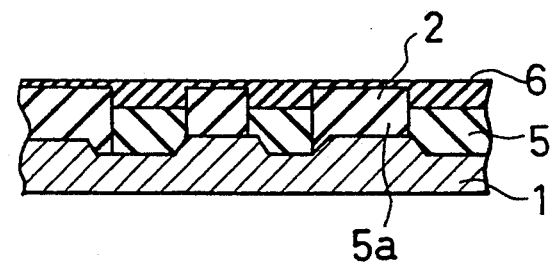

The sample is placed in a chamber. An inner atmosphere of the chamber is replaced with nitrogen, and inner pressure of the chamber is set to 5 Torr. Vaporized hexamethyldisilazane is injected to the chamber to form silylated regions 6 on the sample, as shown in FIG. 4(c).

Figure 4D:
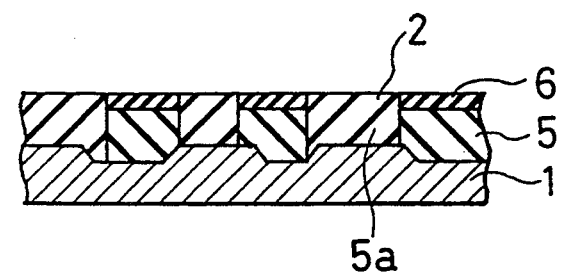

To reactive-ion-etch the sample, a vacuum vessel is employed. The vacuum vessel has parallel plate electrodes. The sample is placed on a cathode of the parallel plate electrodes. Argon gases are introduced to the vacuum vessel, and high-frequency electric power of 50 W is applied between the parallel plate electrodes for one minute to etch the silylated sample, as shown in FIG. 4(d).

Figure 4E:
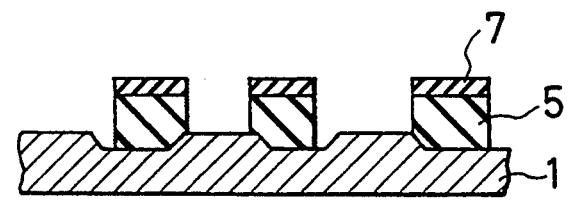

After that, the sample is subjected to reactive ion etching with oxygen under the conditions of 1 W/cm² and $4.5 \times 10^{-3}$ Torr. As a result, an accurate resist pattern of 0.5 $\mu$m in line width is obtained on the silylated exposed portions, as shown in FIG. 4(e).

Although the embodiment has used rare gases of argon, other element gases of the group 0 of periodic table may be used to provide the same effect.

The reactive ion etching (RIE) with oxygen carried out after etching the silylated layers with the rare gases may be achieved with a magnetron utilizing a magnetic field. Instead of the RIE, an ECR etching technique may be employed.

Although the embodiment has exposed the sample to a gaseous atmosphere containing silicon to make the photosensitive resin layer absorb silicon compounds, the absorption may be realized by ion implantation.

As described in the above, the silylated portions of the photosensitive resin layer are etched with the rare gases and then dry-etched with oxygen plasma to form a pattern of high selectivity.

Embodiment 7

This embodiment combines several characteristics of the previously explained embodiments. A silylated layer is formed on a photosensitive resin layer according to the processes of the embodiment 1. Due to the ammonia treatment, the silylated layer is formed at high selectivity. Portions of the silylated layer that extend over non-exposed portions of the resin layer are removed by etching them with argon plasma. This etching process is carried out according to the embodiment 6. Portions of the silylated layer extending on exposed portions of the resist layer are hardened by the oxygen plasma treatment of the embodiment 4. After that, the non-exposed portions of the resin layer are removed by the reactive ion etching (RIE) technique. The embodiment 7 improves the effects of the previously explained embodiments.

Although the preferred embodiments of the invention have been described, it is understood that this invention may be practiced or embodied in still other ways without departing from the spirit or essential character thereof.

What is claimed is:

1. A method of forming a mask on a semiconductor substrate comprising the steps of:
    coating a substrate with a film made of a photosensitive organic resin;
    partially exposing said film to light in order to develop said photosensitive resin in accordance with the pattern of a mask;
    applying ammonia to said film to decompose a carboxylic acid occurring in said photosensitive resin;
    applying a silicon compound to said film to silylate said photosensitive resin exposed to light; and
    removing said developed photoresist resin by etching in order to leave said pattern of said mask in said film
    wherein said ammonia is applied before application of the silicon compound.

2. The method as claimed in claim 1, wherein said silicon compound is hexamethyldisilazane.

3. The method as claimed in claim 1, wherein said photosensitive resin is composed of novolac resin and a photosensitive material.

4. The method as claimed in claim 1, wherein said ammonia is applied to said resin at a temperature of no lower than 60° C.

5. The method as claimed in claim 1, wherein said ammonia is applied to said resin in a chamber at a negative pressure in which said substrate is heated at a temperature of 50° to 120° C.

6. The method as claimed in claim 1, wherein said step of removing said developed photoresist resin is carried out by reactive ion etching with oxygen plasma.

7. The method as claimed in claim 6, wherein said oxygen plasma is generated by applying high frequency voltage between parallel plate electrodes provided in a vacuum chamber.

8. The method as claimed in claim 1, wherein said ammonia is applied after the exposing step.

9. The method as claimed in claim 1, wherein said ammonia is applied before the exposing step.

10. The method as claimed in claim 1, wherein said ammonia decarboxylates said developed photosensitive resin.

11. The method as claimed in claim 1, wherein the application of said ammonia suppresses absorption of said silicon compound into the non-developed photosensitive resin.

12. A method of forming a mask on a semiconductor substrate comprising the steps of:
coating a substrate with a film made of a photosensitive organic resin;
partially exposing said film to light in order to develop said photosensitive resin in accordance with the pattern of a mask;
catalyzing decomposition of carboxylic acid in said photosensitive resin with ammonia;
silylating said photosensitive resin exposed to light with a silazane compound; and
removing said developed photoresist resin by etching in order to leave said pattern of said mask in said film
wherein said silylation step is accelerated by the decomposition of carboxylic acid with ammonia.

* * * * *